United States Patent
Gotoh et al.

[19]

[11] Patent Number: 5,808,519
[45] Date of Patent: Sep. 15, 1998

[54] HERMETICALLY SEALED MILLIMETER-WAVE DEVICE

[75] Inventors: Kei Gotoh; Yoshihiro Notani; Takayuki Katoh, all of Tokyo, Japan

[73] Assignee: Mitsubishi Denki Kabushiki Kaisha, Tokyo, Japan

[21] Appl. No.: 808,688

[22] Filed: Feb. 28, 1997

[30] Foreign Application Priority Data

Aug. 22, 1996 [JP] Japan .................................. 8-221304

[51] Int. Cl.⁶ .................................................. H01P 5/107
[52] U.S. Cl. ............................................. 333/26; 333/247
[58] Field of Search .............................. 333/26, 247, 248, 333/250; 257/664, 728

[56] References Cited

U.S. PATENT DOCUMENTS

| | | | |
|---|---|---|---|
| 4,550,296 | 10/1985 | Ehrlinger et al. | 333/26 |
| 4,716,386 | 12/1987 | Lait | 333/26 |
| 5,202,648 | 4/1993 | McCandless | 333/26 |
| 5,414,394 | 5/1995 | Gamand et al. | 333/26 |

FOREIGN PATENT DOCUMENTS

| | | |
|---|---|---|
| 58-191647 | 12/1983 | Japan . |
| 221744 | 2/1990 | Japan . |
| 5343904 | 12/1993 | Japan . |
| 6252614 | 9/1994 | Japan . |

*Primary Examiner*—Paul Gensler
*Attorney, Agent, or Firm*—Leydig, Voit & Mayer, Ltd.

[57] ABSTRACT

A millimeter-wave device includes a pedestal having an upper surface; a microwave IC chip operating at a millimeter wave band, the chip being mounted on the upper surface of the pedestal; line substrates having respective transmission lines connected to the microwave IC chip, the line substrates being mounted on opposite sides of the microwave IC chip on the upper surface of the pedestal; a lid covering and sealing the microwave IC chip and the line substrates, the lid being disposed opposite the upper surface of the pedestal; and waveguides, each waveguide including a waveguide input/output part having an opening penetrating the pedestal transverse to the upper surface and a waveguide end portion connected to the waveguide input/output part, the waveguides being disposed in the vicinity of opposite ends of the pedestal. The transmission lines of the line substrates and the waveguides are connected to each other by E-plane probes, and the line substrates are mounted covering the openings at the upper surface of the pedestal. Consequently, hermetic sealing of the microwave IC chip can be secured, whereby a millimeter-wave device having low loss and high reliability is obtained.

2 Claims, 6 Drawing Sheets

HERMETICALLY SEALED MILLIMETER-WAVE DEVICE

FIELD OF THE INVENTION

The present invention relates to a millimeter-wave structure and, more particularly, to a device that guides signals to the vicinity of a device through a waveguide and makes a low-loss connection through an E-plane probe, in which a microwave IC chip is reliably hermetically sealed and attenuation of the signals is suppressed, whereby deterioration of the device characteristics is prevented.

BACKGROUND OF THE INVENTION

Generally, in a device employed in a millimeter wave band, signals are unfavorably attenuated between a microwave IC chip and a waveguide inputting or outputting the signals, while they pass through a line, a bonding wire or a bump, and a wall of a package, as compared with the case of a device employed in a lower frequency band. In order to suppress this attenuation of signals, a package in which a waveguide guiding the signals is disposed closer to the chip is adopted, whereby the attenuation of signals passing through the line, the bonding wire, and the wall of the package is suppressed.

FIG. 7(a) is a cross-sectional view illustrating a prior art millimeter-wave device package, and FIG. 7(b) is a plan view illustrating a front surface of the prior art package before covered with a lid. In these figures, reference numeral 10 designates a millimeter-wave device package. The package 10 comprises a pedestal 4 and a lid 5. A microwave IC chip 1 and line substrates 2 on which microstrip lines 2a are disposed are mounted on the pedestal 4 of the package. Bonding wires 3 connect the microstrip lines 2a to the respective terminals of the microwave IC chip 1. Each waveguide 7 comprises a waveguide input/output part 7a and a waveguide end portion 7b, and is connected to the line substrate 2 by an E-plane probe. A portion 6 for forming the waveguide end portion is provided at the lid 5. The waveguide input/output part 7a penetrates the pedestal 4, and the waveguide end portion 7b is constituted by a sidewall of the pedestal 4, the lid 5, and the portion 6.

The millimeter-wave device package 10 is fabricated with the microwave IC chip 1 and the line substrates 2, which are to be sealed, adhered to the pedestal 4 of the package so that the line substrates 2 and the waveguides 7 are connected to each other by an E-plane probe, and the lid 5 is adhered to the pedestal 4 with such as a solder to seal the microwave IC chip 1 and the line substrates 2.

In the prior art millimeter-wave device package 10 having a structure as shown in FIGS. 7(a) and 7(b), in which the waveguides are disposed closer to the chip, there are air flows from the waveguides 7 into the package or reverse thereto, at the connection by E-plane probe between the waveguides 7 and the line substrates 2, so that airtightness of the microwave IC chip is not secured, and condensation or the like arises, effected by other devices connected to the waveguides or working circumstances, resulting in a reduction in the reliability of the device.

SUMMARY OF THE INVENTION

It is an object of the present invention to provide a millimeter-wave device having a structure in which a waveguide is disposed closer to a microwave IC chip, securing airtightness of the microwave IC chip, thereby having low loss and high reliability.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, in a millimeter-wave device, a microwave IC chip operating at a millimeter wave band is mounted in the middle of an upper surface of a pedestal; line substrates having respective lines connected to the microwave IC chip are mounted on opposite ends of the upper surface of the pedestal; a lid for covering and sealing the microwave IC chip and the line substrates is disposed over the upper surface of the pedestal; and waveguides each comprising a waveguide input/output part having an opening penetrating the pedestal up and downwards and a waveguide end portion connected to the waveguide input/output part at its upper portion are disposed in the vicinity of opposite ends of the pedestal. The lines of the line substrates and the waveguides are connected to each other by respective E-plane probes, and the line substrates are mounted so as to cover the respective openings in the upper surface of the pedestal. Consequently, airtightness of the microwave IC chip can be secured, whereby a millimeter-wave device having low loss and high reliability can be obtained.

According to a second aspect of the present invention, in a millimeter-wave device, a microwave IC chip operating at a millimeter wave band and having lines on opposite ends of the chip, each line connected to an element in the chip, is mounted on an upper surface of a pedestal; a lid for covering and sealing the microwave IC chip is disposed over the upper surface of the pedestal; and waveguides each comprising a waveguide input/output part having an opening penetrating the pedestal up and downwards and a waveguide end portion connected to the waveguide input/output part at its upper portion are disposed in the vicinity of opposite ends of the pedestal. The lines of the microwave IC chip and the waveguides are connected to each other by respective E-plane probes, and the microwave IC chip is mounted so as to cover the respective openings in the upper surface of the pedestal. Consequently, airtightness of the front surface of the microwave IC chip can be secured, whereby a millimeter-wave device having low loss and high reliability can be made with fewer processes.

According to a third aspect of the present invention, in the millimeter-wave device of the first aspect of the invention, a rear surface metal is disposed on a rear surface of the line substrate, except for regions corresponding to the openings of the waveguide input/output parts. Consequently, the airtightness of the microwave IC chip can be further improved.

According to a fourth aspect of the present invention, in the millimeter-wave device of the second aspect of the invention, a rear surface metal is disposed on a rear surface of the microwave IC chip, except for regions corresponding to the openings of the waveguide input/output parts. Consequently, the airtightness of the microwave IC chip can be further improved.

According to a fifth aspect of the present invention, in a millimeter-wave device, a microwave IC chip operating at a millimeter wave band is mounted in the middle of an upper surface of a pedestal; wall parts are disposed on the circumference of the pedestal; line substrates having respective lines connected to the microwave IC chip, each line penetrating the wall part of the pedestal and projecting to the outside of the wall part, are mounted on opposite ends of the upper surface of the pedestal; a lid for covering and sealing the microwave IC chip and main portions of the line substrates is disposed on the wall parts of the pedestal; and waveguide body portions are disposed on the wall parts from which the line substrates project to the outside with relative to the pedestal, and the outer wall surfaces of the pedestal, the waveguide body portions constituting waveguides with required portions of the outer wall surfaces of the pedestal serving as parts of the inner walls of the waveguides constituted. Consequently, a signal path can be shortened, whereby a millimeter-wave device having low loss and high reliability can be obtained.

DETAILED DESCRIPTION OF THE PREFERRED EMBODIMENTS

[Embodiment 1]

A description is given of a first embodiment of the present invention.

Figure 1:
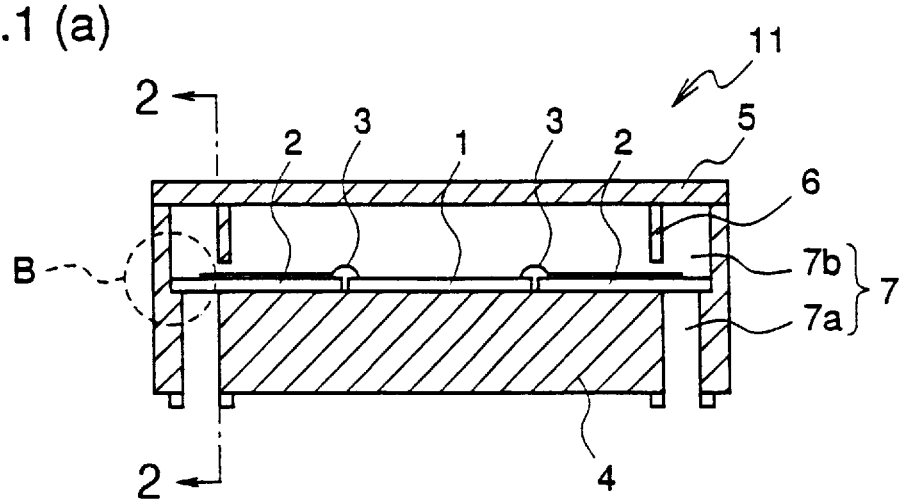
FIG. 1(a) is a cross-sectional view illustrating a millimeter-wave device package in accordance with a first embodiment of the present invention.
FIG. 1(b) is an enlarged view of the package in the vicinity of a circle B shown in FIG. 1(a).
Figure 1:
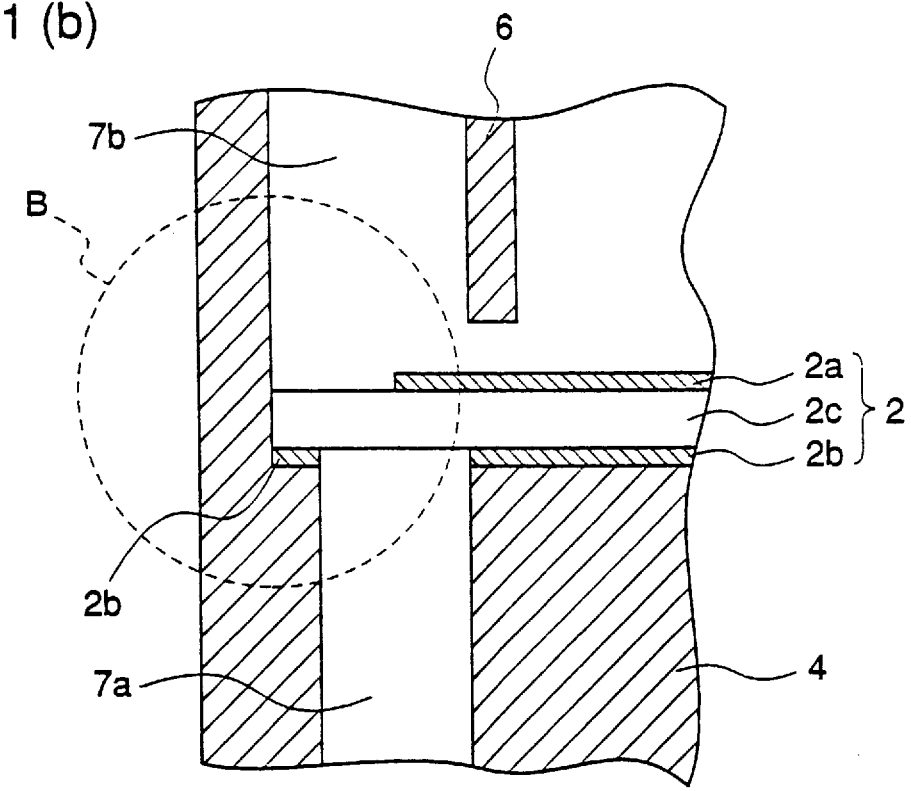
Figure 2:
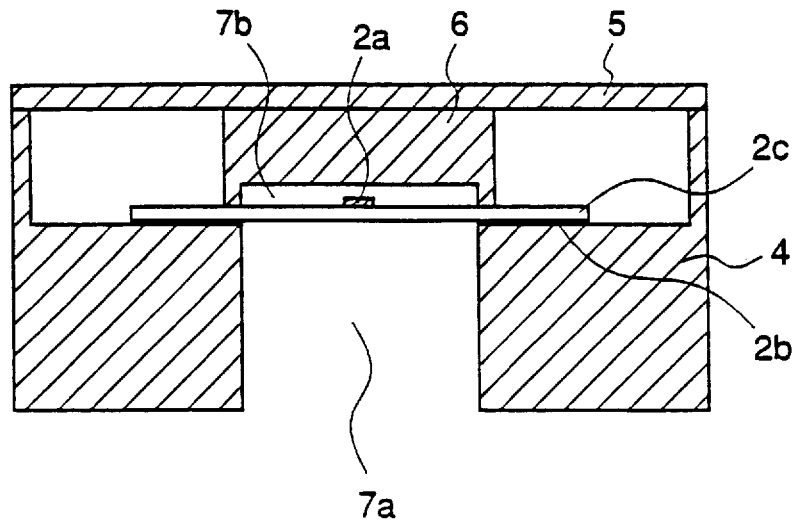
FIG. 2 is a side view of the package taken along a dash and dot line 2-2' shown in FIG. 1(a).

FIGS. 1(a)–1(b) and 2 are diagrams illustrating a millimeter-wave device package according to the first embodiment of the invention. FIG. 1(a) is a cross-sectional view of the millimeter-wave device package taken along a plane parallel to the signal flow, and FIG. 1(b) is an enlarged view of the package in the vicinity of a circle B shown in FIG. 1(a). FIG. 2 is a side view of the package taken along a plane shown by a dash and dot line 2-2' in FIG. 1(a). In these figures, reference numeral 11 designates a millimeter-wave device package. The package 11 comprises a pedestal 4 and a lid 5. A microwave IC chip 1 operating at a millimeter wave band and line substrates 2 are mounted on the pedestal 4 of the package. Each line substrate 2 comprises a microstrip line 2a, a rear surface metal 2b and a dielectric substrate 2c. The microstrip line 2a is disposed on a front surface of the dielectric substrate 2c, and the rear surface metal 2b is disposed on a rear surface of the dielectric substrate 2c. The dielectric substrate 2c has a low dielectric constant and a small loss tan δ and comprises a material such as alumina, glass or polytetrafluoroethylene. A dielectric substrate comprising a desired material and having a desired thickness is employed depending on the frequency of signals used and a line width. Bonding wires 3 connect the microstrip lines 2a to the respective terminals of the microwave IC chip 1. Each waveguide 7 comprises a waveguide input/output part 7a and a waveguide end portion 7b. A portion 6 for forming the waveguide end portion is provided at the lid 5. The waveguide input/output part 7a penetrates the pedestal 4, and the waveguide end portion 7b is constituted by a sidewall of the pedestal 4, the lid 5 and the portion 6. The waveguide 7 is connected to the line substrate 2 by an E-plane probe, and Au-plating or vapor deposition of Au is applied to the inner wall portions of the waveguide 7.

Figure 3:
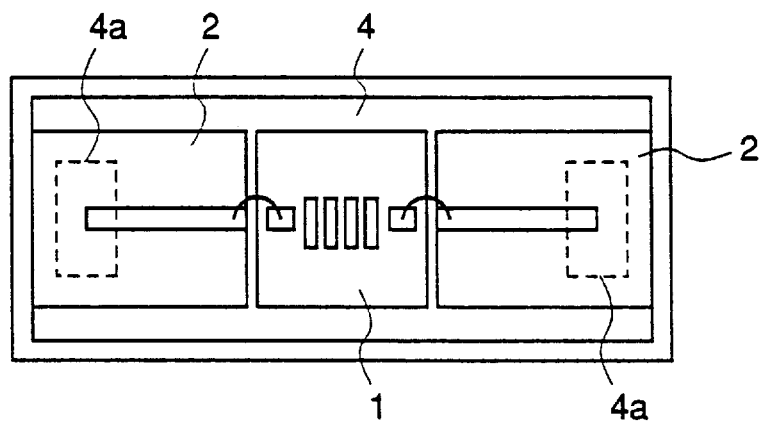
FIG. 3 is a plan view illustrating a front surface of the millimeter-wave device package before being covered with a lid, according to the first embodiment of the invention.
Figure 4:
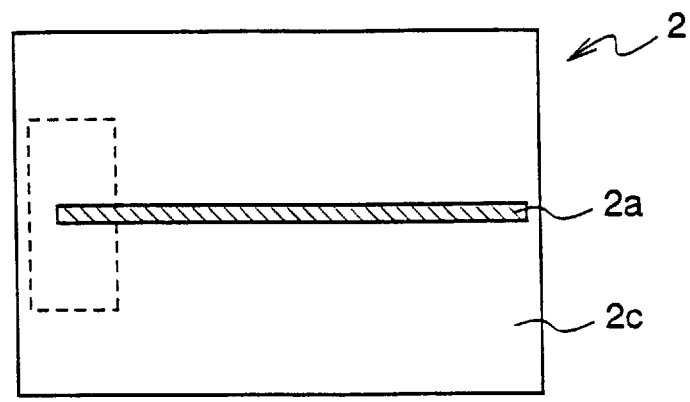
FIGS. 4(a) and 4(b) are plan views respectively illustrating front and rear surfaces of a line substrate of the millimeter-wave device package, according to the first embodiment of the invention.
Figure 4:
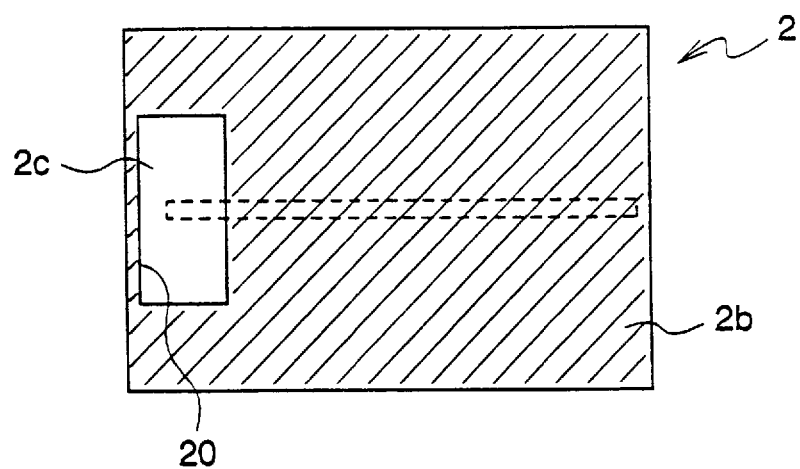

FIG. 3 is a plan view illustrating a front surface of the package before being covered with the lid, according to the first embodiment of the invention. In the figure, reference numeral 4a designates an opening of the waveguide input/output part 7a, which opens in an upper surface of the pedestal 4 of the package. FIGS. 4(a) and 4(b) are diagrams illustrating the line substrate 2 used for the millimeter-wave device package of the first embodiment of the invention. More specifically, FIG. 4(a) is a plan view illustrating a front surface of the line substrate 2, and FIG. 4(b) is a plan view illustrating a rear surface of the line substrate 2. In these figures, reference numeral 20 designates a region of the line substrate 2 where the rear surface metal 2b is absent, i.e., the dielectric substrate 2c is exposed. The region 20 of the line substrate 2 faces the opening 4a of the waveguide input/output part 7a when the line substrate 2 is mounted on the pedestal 4 of the package.

In the millimeter-wave device package 11 according to the first embodiment, the line substrate 2 is adhered to the pedestal 4 with such as a solder to completely cover the opening 4a of the waveguide input/output part 7a which opens in the upper surface of the pedestal 4.

A description is given of the function and effects.

In the millimeter-wave device package 11 of the first embodiment of the invention, one end of the waveguide input/output part 7a has the opening 4a in the upper surface of the pedestal 4, and the line substrate 2 is mounted on the pedestal 4 so as to perfectly cover the opening 4a. Therefore, air at the side of the microwave IC chip is separated from air at the side of the waveguide input/output part by the line substrate 2, whereby hermetic sealing of the microwave IC chip 1 can be secured.

In addition, as shown by the circle B in FIGS. 1(a)–1(b) and shown in FIG. 3, in order that the line substrate 2 perfectly covers the opening 4a, the pedestal 4 is formed so that at least the vicinity of the opening 4a and the upper surface of the pedestal 4 are in the same plane, the rear surface metal 2b is formed on the region of the line substrate 2 in contact with the upper surface of the pedestal 4, without being formed on the region of the line substrate 2 facing the opening 4a. This rear surface metal 2b is adhered to the pedestal 4 with such as a solder. Therefore, the opening 4a of the waveguide input/output part 7a is perfectly covered, resulting in high airtightness of the microwave IC chip 1. Further, since the line substrate 2 is used for covering the opening 4a, no other member is required for airtightly sealing the opening 4a and processes for mounting the line substrate 2 on the pedestal 4 are not complicated. Thereby, the conventional mounting processes used in the prior art can be adopted.

In this way, since the opening 4a of the waveguide input/output part 7a at the upper surface of the pedestal 4 is covered with the line substrate 2 connected to the waveguide 7 by an E-plane probe, the airtightness of the microwave IC chip 1 is secured, whereby a millimeter-wave device package having low loss and high reliability can be obtained with the conventional processes used in the prior art.

While in the first embodiment, the package has the straight waveguide input/output parts 7a as shown in FIGS. 1(a) and 1(b), when another waveguide forming member having such as an L shape is adhered to the package body with such as a silver solder, inputting and outputting of signals can be performed from the right and left directions.

[Embodiment 2]

A description is given of a second embodiment of the present invention.

Figure 5:
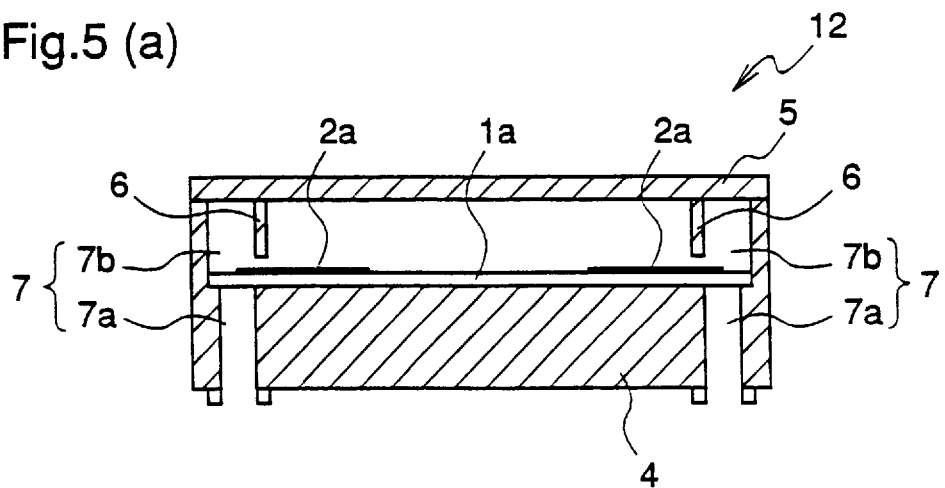
FIG. 5(a) is a cross-sectional view illustrating a millimeter-wave device package in accordance with a second embodiment of the present invention.
FIG. 5(b) is a plan view illustrating a front surface of the package before being covered with a lid.
Figure 5:
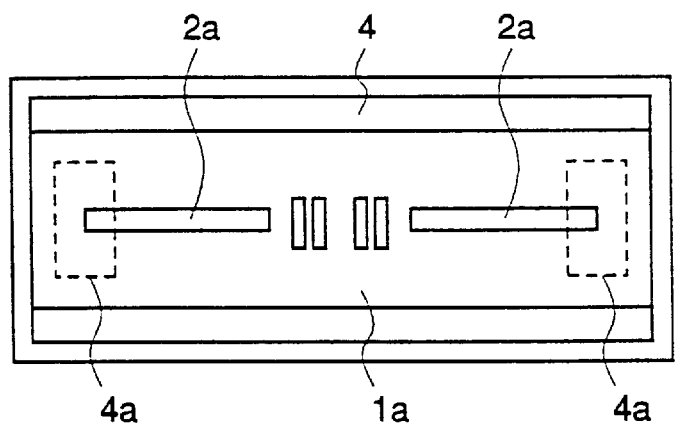

FIG. 5(a) is a cross-sectional view illustrating a millimeter-wave device package taken along a plane parallel to the signal flow, and FIG. 5(b) is a plan view illustrating a front surface of the package before being covered with a lid, according to the second embodiment of the invention. In these figures, the same reference numerals as shown in FIGS. 1(a) and 1(b) designate the same or corresponding parts. Reference numeral 1a designates a microwave IC chip comprising a microwave circuit and microstrip lines 2a for inputting and outputting signals, and the microwave circuit and the microstrip lines 2a are disposed on a substrate. In the second embodiment of the invention, the pedestal 4, the lid 5, and the portion 6 for forming the waveguide end portion shown in FIG. 1(a) are identical to those according to the first embodiment. The rear surface metal 2b is disposed on a rear surface of the microwave IC chip 1a, except for the region facing the opening 4a of the waveguide input/output part 7a.

In the millimeter-wave device package 12 according to the second embodiment, the microwave IC chip 1a is adhered to the pedestal 4 with such as a solder so as to perfectly cover the opening 4a of the waveguide input/output part 7a which opens at the upper surface of the pedestal 4.

A description is given of the function and effects.

In the millimeter-wave device package 12 of the second embodiment of the invention, one end of the waveguide input/output part 7a has the opening 4a at the upper surface of the pedestal 4, and the microwave IC chip 1a is mounted on the pedestal 4 so as to perfectly cover the opening 4a. Therefore, air at the front side of the microwave IC chip 1a is separated from air at the rear side of the microwave IC chip 1a, whereby airtightness of the front surface of the microwave IC chip 1a can be secured.

In addition, in order that the microwave IC chip 1a perfectly cover the opening 4a, the pedestal 4 is formed so that at least the vicinity of the opening 4a and the upper surface of the pedestal 4 are in the same plane, the rear surface metal 2b is formed on the region of the microwave IC chip 1a in contact with the upper surface of the pedestal 4, without being formed on the region of the microwave IC chip 1a facing the opening 4a. This rear surface metal 2b is adhered to the pedestal 4 with such as a solder. Therefore, the opening 4a of the waveguide input/output part 7a is perfectly covered, resulting in high airtightness at the side of the microwave IC chip 1a. Further, since the microwave IC chip 1a is used for covering the opening 4a, no line substrate or other member is required for airtightly sealing the opening 4a and processes for mounting the microwave IC chip 1a on the pedestal 4 are not complicated, whereby the millimeter-wave device package 12 can be made with fewer processes than in the prior art.

In this way, since the opening 4a of the waveguide input/output part 7a is covered with the microwave IC chip 1a on which the microstrip lines 2a connected to the waveguide 7 by an E-plane probe are disposed, the airtightness at the side of the microwave IC chip 1a is secured, whereby a millimeter-wave device package having low loss and high reliability can be obtained with fewer processes than in the prior art.

[Embodiment 3]

A description is given of a third embodiment of the present invention.

Figure 6:
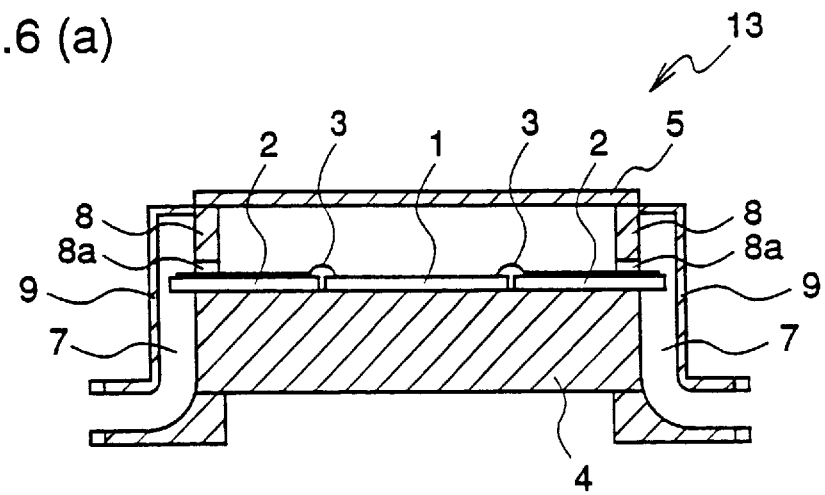
FIG. 6(a) is a cross-sectional view illustrating a millimeter-wave device package in accordance with a third embodiment of the present invention.
FIG. 6(b) is a partially perspective view for explaining the connection between a microstrip line projecting by a feed through method and a waveguide.
Figure 6:
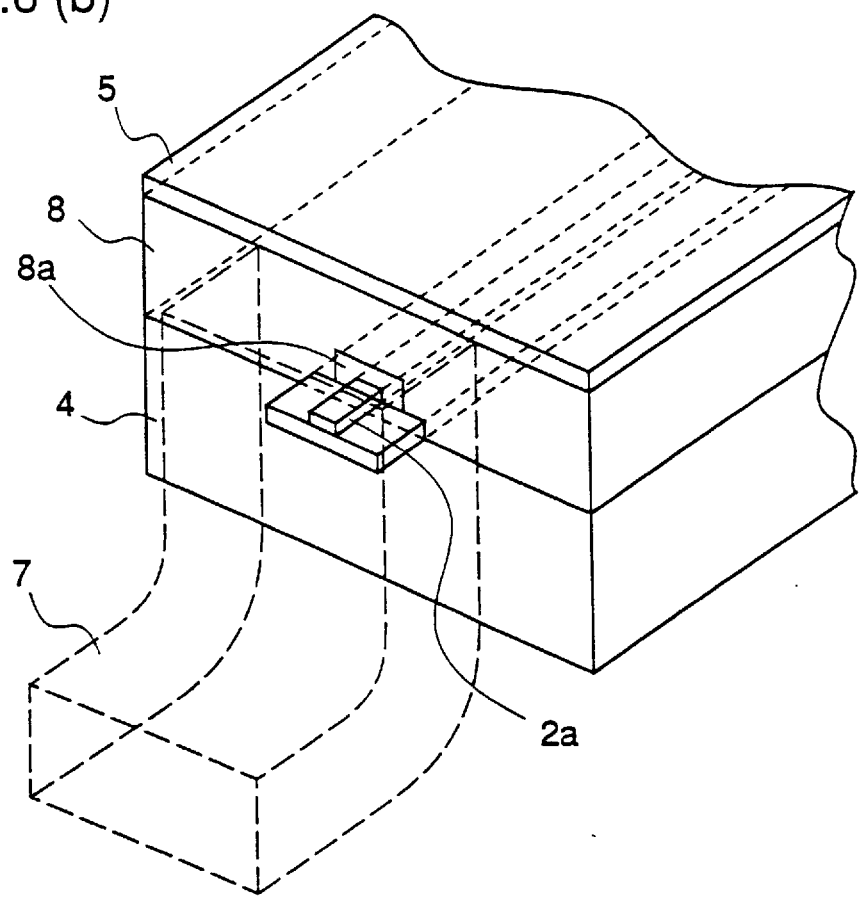
Figure 7:
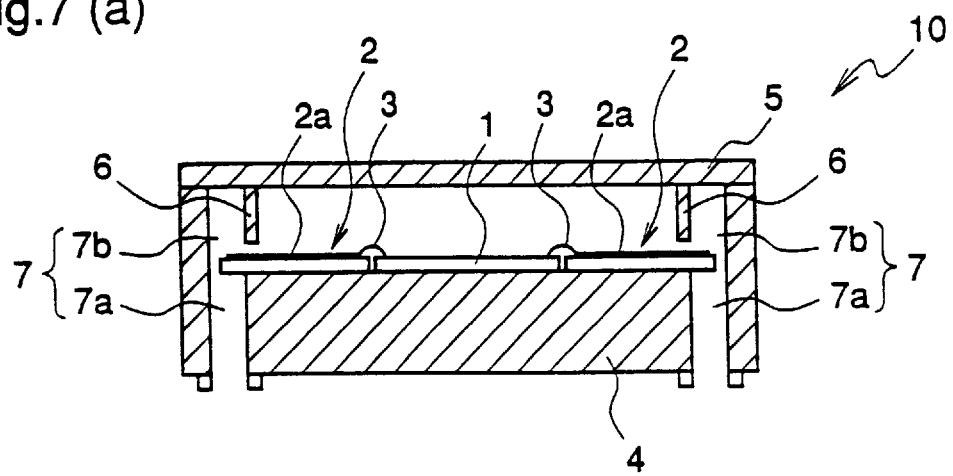
FIG. 7(a) is a cross-sectional view illustrating a prior art millimeter-wave device package.
FIG. 7(b) is a plan view illustrating a front surface of the prior art package before being covered with a lid.
Figure 7:
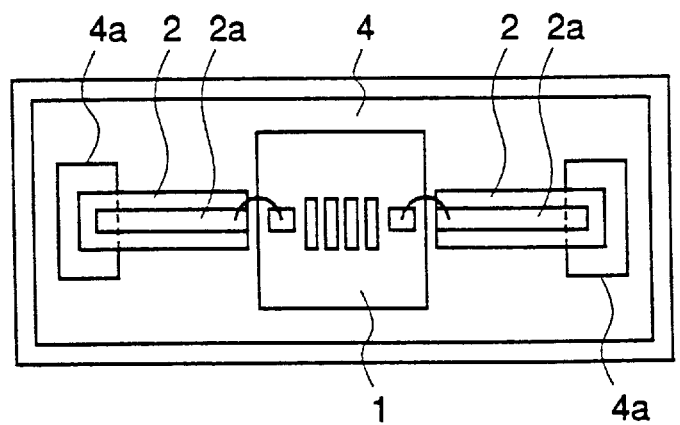

FIGS. 6(a) and 6(b) are diagrams illustrating a millimeter-wave device package according to the third embodiment of the invention. More specifically, FIG. 6(a) is a cross-sectional view of the package taken along a plane parallel to the signal flow, and FIG. 6(b) is a partially perspective view for explaining the connection between the microstrip line 2a and the waveguide 7. In these figures, the same reference numerals as those shown in FIGS. 1(a) and 1(b) designate the same or corresponding parts. Reference numeral 13 designates a millimeter-wave device package having sidewalls 8. Insulating portions 8a comprising a low-loss material, such as ceramic or glass, are disposed on respective regions of the sidewalls 8 adjacent to the microstrip lines 2a. Waveguide body portions 9 for forming the waveguides 7 are adhered to the sidewalls 8 of the package and the side surfaces of the pedestal 4 with such as a silver solder.

In the millimeter-wave device package 13 according to the third embodiment, the microstrip line 2a projecting to the outside of the sidewall 8 by a feed through method is connected by an E-plane probe to the waveguide 7 comprising the pedestal 4, the sidewall 8 and the waveguide body portion 9.

A description is given of the function and effects.

In the millimeter-wave device package 13 of the third embodiment of the invention, the microstrip line 2a projects to the outside of the sidewall 8 by a feed through, the waveguide 7 is provided at the sidewall 8 and the outer wall surface of the pedestal 4, and contains a required region of the outer wall surface as a part of its inner wall, and the microstrip line 2a and the waveguide 7 are connected by an E-plane probe. Therefore, the microstrip line 2a projecting to the outside is directly connected to the waveguide 7, whereby the signal path can be shortened.

In this way, since a construction in which the microstrip line 2a projects to the outside of the sidewall 8 by a feed through, and the waveguide 7 comprising the pedestal 4, the sidewall 8 and the waveguide body portion 9 are connected to each other by an E-plane probe, the airtightness of the microwave IC chip 1 package is secured and the signal path is shortened, whereby attenuation of the signals can be suppressed. As a result, a millimeter-wave device package airtightly sealing a microwave IC chip and suppressing attenuation of signals can be obtained.

What is claimed is:

1. A millimeter-wave device including:
   an electrically conductive pedestal having an upper surface and side surfaces transverse to the upper surface;

a microwave IC chip operating at a millimeter wave band, the chip being mounted on the upper surface of the pedestal;

an electrically conductive circumferential wall having a pair of opposed side walls and disposed on the upper surface of the pedestal and including openings in each of the opposed side walls;

two line substrates, each line substrate having a transmission line connected to the microwave IC chip, each transmission line penetrating through a respective one of the openings in each of the side walls of the circumferential wall and projecting outside of the circumferential wall, the line substrates being mounted on the upper surface of the pedestal on opposite sides of the microwave IC chip;

electrically insulating portions disposed in the openings in the pair of opposing walls, each electrically insulating portion being hermetically sealed to the respective side wall, line substrate, and transmission line projecting through the respective opening outside of the circumferential wall;

a lid covering and sealing the microwave IC chip and portions of the line substrates, the lid being disposed on and hermetically sealed to the circumferential wall opposite the upper surface of the pedestal; and two waveguide body portions, each of the waveguide body portions being disposed on respective opposed side walls of the circumferential wall through which a respective line substrate projects, the opposed walls of the circumferential wall, the side walls of the pedestal, and the waveguide body portions respectively constituting waveguides.

2. The millimeter-wave device of claim 1 wherein the line substrates and corresponding transmission lines projecting into the waveguides do not contact the waveguide body portions.

* * * * *